United States Patent
Cheung et al.

(10) Patent No.: US 6,344,404 B1
(45) Date of Patent: Feb. 5, 2002

(54) METHOD OF SEPARATION FILMS FROM BULK SUBSTRATES BY PLASMA IMMERSION ION IMPLANTATION

(75) Inventors: Nathan W. Cheung, Albany; Xiang Lu; Chenming Hu, both of Berkeley, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/431,007

(22) Filed: Nov. 1, 1999

Related U.S. Application Data (63) Continuation of application No. 08/915,132, filed on Aug. 20, 1997, now Pat. No. 6,027,988.
(60) Provisional application No. 60/047,833, filed on May 28, 1997.

(51) Int. Cl.[7] ............................................. H01L 21/265
(52) U.S. Cl. ...................................................... 438/513
(58) Field of Search .............................. 438/513, 977, 438/514, 528; 427/38, 39

(56) References Cited

U.S. PATENT DOCUMENTS

| | | | | |
|---|---|---|---|---|
| 5,920,764 A | * | 5/1999 | Hanson et al. | 438/459 |
| 5,882,987 A | * | 6/1999 | Krikrishnan | 438/977 |
| 6,013,563 A | * | 1/2000 | Henley et al. | 438/458 |
| 6,027,988 A | | 2/2000 | Cheung et al. | 438/513 |
| 6,048,411 A | * | 4/2000 | Henley et al. | 438/455 |
| 6,083,324 A | * | 7/2000 | Henley et al. | 438/471 |

* cited by examiner

Primary Examiner—Savitri Mulpuri
(74) Attorney, Agent, or Firm—Townsend and Townsend and Crew LLP (57) ABSTRACT

A technique for fabricating substrates such as a silicon-on-insulator substrate using a plasma immersion ion implantation ("PIII") system 10. The technique includes a method, which has a step of providing a substrate 2100. Ions are implanted 2109 into a surface of the substrate to a first desired depth to provide a first distribution of the ions using a plasma immersion ion implantation system 10. The implanted ions define a first thickness of material 2101 above the implant. Global energy is then increased of the substrate to initiate a cleaving action, where the cleaving action is sufficient to completely free the thickness of material from a remaining portion of the substrate. By way of the PIII system, the ions are introduced into the substrate in an efficient and cost effective manner.

59 Claims, 6 Drawing Sheets

METHOD OF SEPARATION FILMS FROM BULK SUBSTRATES BY PLASMA IMMERSION ION IMPLANTATION

CROSS-REFERENCE TO RELATED APPLICATIONS

This continuation application claims priority U.S. application Ser. No. 08/915,132, filed on Aug. 20, 1997, now U.S. Pat. No. 6,027,988 and, to U.S. Provisional Patent Application Serial No. 60/047,833, which has been filed on May 28, 1997, and which is hereby incorporated by reference for all purposes.

GOVERNMENT RIGHTS NOTICE

This invention was made with government support under Grant No. F49620-97-1-0220-03/98 awarded by the Air Force (AFSOR) Joint Services Electronics Program (JSEP), and Grant No. ECS-9509800 awarded by the National Science Foundation. The Government has certain rights to this invention.

BACKGROUND OF THE INVENTION

The present invention relates to the manufacture of substrates. More particularly, the invention provides a technique including a method and device for introducing ions into a substrate for fabricating silicon-on-insulator wafers using a separating process in a cost effective and efficient manner.

Techniques have been proposed or used for the manufacture of silicon-on-insulator ("SOI") wafers. One of these techniques is called "separation by implantation of oxygen," commonly termed SIMOX. A detailed description of this process is described in Stanley Wolf Ph.D., SILICON PROCESSING FOR THE VLSI ERA (Volume 2), pages 66–79, which are hereby incorporated by reference. This technique generally uses conventional beam-line ion implanters for introducing the oxygen into the silicon wafer.

A limitation with the conventional SIMOX process is generally the cost of the resulting wafer. This cost often stems from the long time needed to implant a sufficient dose of oxygen into the silicon wafer. Since ion implanters is often difficult to allocate the implanter for use in the conventional SIMOX process, which is often used for a variety of other integrated circuit processing operations. Additionally, many fabrication facilities (e.g., integrated circuit and wafer) simply cannot afford purchasing additional ion implantation equipment due to its excessive cost. Accordingly, silicon-on-insulator wafers made using the conventional SIMOX process are often costly and generally take a long time to fabricate.

Another technique for fabricating silicon-on-insulator wafer is commonly termed Smart Cut™. This technique uses conventional beam-line ion implantation equipment to introduce hydrogen to a selected depth into a substrate. The substrate is bonded to an insulating layer overlying a bulk substrate to form a multi-layered substrate structure. The multi-layered substrate is introduced into a furnace to increase the global temperature of the entire substrate, which blisters off a portion of substrate material from the substrate at the selected depth, thereby leaving a thin film of substrate material on the insulating material to form the silicon-on-insulator wafer. U.S. Pat. No. 5,374,564, which is in the name of Michel Bruel ("Bruel"), and assigned to Commissariat a l'Energie Atomique in France, describes this technique.

Unfortunately, the use of conventional beam line ion implantation equipment is quite expensive. In fact, the Smart Cut™ process generally requires large doses of hydrogen, which often takes a long time to implant. Additionally, the long time necessary to implant hydrogen by the implanter generally increases processing costs, which produces a higher cost wafer. Furthermore, the conventional beam line implanter often represents one of the highest equipment costs in a fabrication facility, which adds to the cost of producing the wafer. Numerous other limitations also exist with the use of the conventional beam line ion implantation equipment.

From the above, it is seen that a technique for fabricating a silicon-on-insulator wafer which is cost effective and efficient is often desirable.

SUMMARY OF THE INVENTION

According to the present invention, an improved technique for implanting substrates in the manufacture of wafers such as silicon-on-insulator wafers is provided. In particular, the present invention uses a plasma immersion ion implantation ("PIII") process for introducing ions into a silicon wafer for fabricating a silicon-on-insulator substrate. The invention also can be applied to almost any application for removing a film(s) of material from a substrate.

In a specific embodiment, the present invention provides a method for fabricating substrates using a plasma immersion ion implantation ("PIII") system. For example, see paper by N. W. Cheung, "Plasma Immersion Ion Implantation For Semiconductor Processing," Material Chemistry and Physics, Vol. 46/2–3, pp. 132–139 (1996), which is hereby incorporated by reference for all purposes. See also X. Lu, S. S. K. Iyer, J. Min, Z. Fan, J. B. Liu, P. K. Chu, C. Hu, and N. W. Cheung, entitled "SOI Material Technology Using Plasma Immersion Ion Implantation," Proceedings 1996 IEEE International SOI Conference (October 1996), which is also hereby incorporated by reference for all purposes. The method includes steps of providing a substrate and implanting particles such as ions from a plasma source with specific ion composition into a surface of the substrate to a first desired depth to provide a first distribution of the ions using the PIII system. The implanted ions define a first thickness of material above the implant. To remove the first thickness of material from the substrate, a step of increasing energy of the substrate to initiate a cleaving action is included. The cleaving action is sufficient to completely free the thickness of material from a remaining portion of the substrate. By way of the PIII system, the ions are introduced into the substrate in an efficient and cost effective manner. In some embodiments, the implanting step is a multiple implant step using different conditions to facilitate cleaving the thickness of material. These conditions include, for example, doses, energies, temperatures, species, among others.

In an alternative embodiment, the present invention provides another method for fabricating substrates using a plasma immersion ion implantation system. The method includes steps of providing a substrate and implanting particles (e.g., ions) into a surface of the substrate to a first desired depth to provide a first distribution of the ions using the plasma immersion ion implantation system. The implanted ions defines a first thickness of material above the implant. The first thickness of material is removed from the substrate at the first desired depth. By way of the PIII system, the ions are introduced into the substrate at an efficient and cost effective manner. In some embodiments, the implanting step is a multiple implant step(s) using different conditions to facilitate removing the thickness of material from the substrate. These conditions include, for example, doses, energies, temperatures, species, among others.

Numerous benefits are achieved by way of the present invention over pre-existing techniques. In particular, the present invention relies upon a PIII system which can easy introduce ions into a substrate in a relatively timely process. The PIII process is often significantly faster than conventional implanters, e.g., beam line. Additionally, the PIII process can be readily incorporated into conventional fabrication facilities in an efficient and cost effective manner. Accordingly, the present invention achieves these and others benefits described herein.

The present invention achieves these benefits and others in the context of known process technology. However, a further understanding of the nature and advantages of the present invention may be realized by reference to the latter portions of the specification and attached drawings.

DESCRIPTION OF A SPECIFIC EMBODIMENT

According to the present invention, an improved technique for implanting substrates in the manufacture of wafers such as silicon-on-insulator wafers is provided. In particular, the present invention uses a plasma immersion ion implantation process for introducing ions into a silicon wafer for fabricating silicon-on-insulator substrates and other multi-layered substrates.

Figure 1:
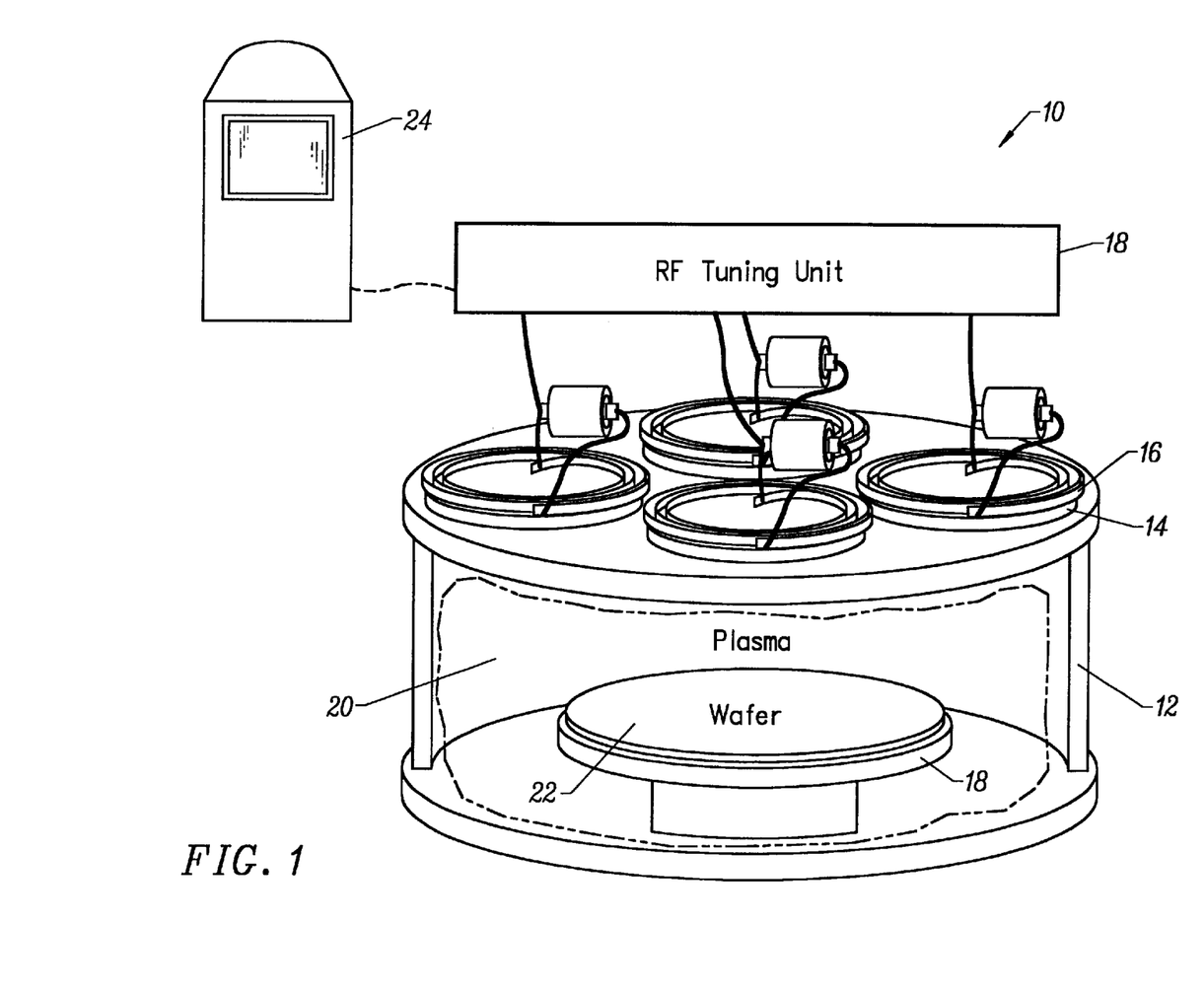
FIG. 1 is a simplified diagram of a plasma immersion ion implantation system.

FIG. 1 is a simplified diagram of a plasma immersion ion implantation system 10 according to the present invention. This diagram is merely an illustration and should not limit the scope of the claims herein. One of ordinary skill in the art would recognize other variations, modifications, and alternatives. System 10 includes a variety of elements such as a chamber 12, and a plurality radio frequency sources 16. Each source 16 is mounted on a quartz plate 14. Each source 16 is coupled to an rf tuning unit 18 and is capable of providing a discharge 20 in the chamber. Suceptor 18 has a wafer 22 thereon, which can be heated or cooled.

A controller 24 oversees the functions of system 10. Controller 24 can have a variety of features such as a monitor, a central processing unit, and sufficient memory, including dynamic and static memory devices. Controller 24 also has a graphical user interface ("GUI"), which has menus for a variety of process recipes. The recipes are in the form of a computer program or the like. The controller can also be coupled to a local or wide area network, including the Internet. Further details of the PIII system can be found in Qian et al, "A Plasma Immersion Ion Implantation Reactor For ULSI Fabrication," Nuclear Instrument and Methods, Vol. B55, pp. 884–887 (1991), which is hereby incorporated by reference for all purposes.

A process for fabricating a silicon-on-insulator substrate according to the present invention may be briefly outlined as follows:

(1) Provide a donor silicon wafer (which may be coated with a dielectric material);

(2) Introduce particles into the silicon wafer to a selected depth to define a thickness of silicon film;

(3) Provide a receptor (i.e., target) substrate material (which may be coated with a dielectric material);

(4) Bond the donor silicon wafer to the receptor substrate material by joining the implanted face to the receptor substrate material;

(5) Increase global stress (or energy) of implanted region at selected depth to free the thickness of silicon film from the silicon wafer;

(6) Complete bonding of silicon wafer to the receptor substrate; and (7) Polish a surface of the thickness of silicon film, if desirable.

The above sequence of steps provides a process for separating a film of material from a substrate using a novel PIII implantation technique to form, for example, a silicon-on-insulator wafer. The steps can use a PIII apparatus such as the one described above, but can also be others. This sequence of steps is merely an example and should not limit the scope of the claims defined herein. Further details with regard to the above sequence of steps are described below in references to the Figs.

FIGS. 2–7 are simplified cross-sectional view diagrams of substrates undergoing a fabrication process for a silicon-on-insulator wafer according to the present invention. These diagrams are merely illustrations and should not limit the scope of the claims herein. One of ordinary skill in the art would recognize other variations, alternatives, and modifications.

Figure 2:
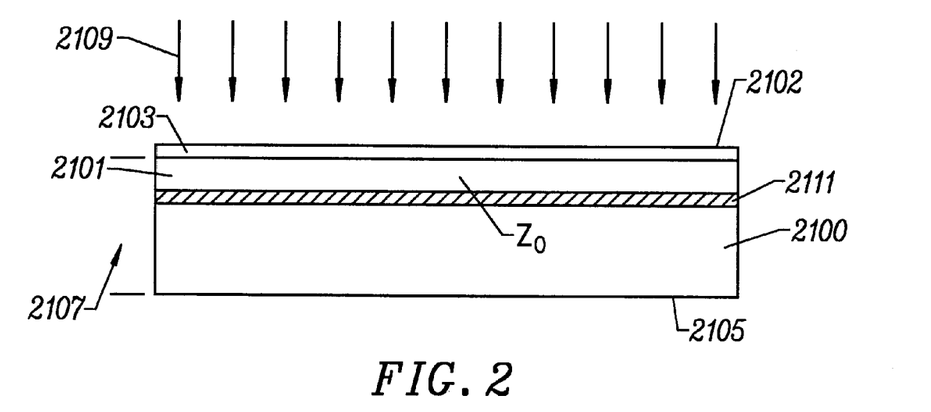
FIGS. 2–7 are simplified cross-sectional view diagrams of a process for fabricating a silicon-on-insulator wafer according to the present invention.

The process begins by providing a semiconductor substrate similar to the silicon wafer 2100, as shown by FIG. 2. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($Z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for implanting particles and removing the material region 2101 using the following sequence of steps for the fabrication of a silicon-on-insulator wafer.

Selected energetic particles 2109 implant through the top surface of the silicon wafer to a selected depth, which defines the thickness of the material region, termed the thin film of material. As shown, the particles have a desired concentration 2111 at the selected depth ($Z_0$). A variety of techniques can be used to implant the energetic particles into the silicon wafer. According to the present invention, however, a PIII technique will be used to introduce the particles into the silicon wafer. The PIII technique can be provided by the aforementioned apparatus, as well as others. In most embodiments, the particles placed in the substrate alter mechanical and/or chemical properties of the bulk substrate. A dose rate can range from about $10^{15}$ ions/$cm^2$-second and higher, and is not influenced by increasing substrate area, since the entire substrate is implanted at the same time.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

In a specific embodiment, the particles are introduced at a selected temperature to prevent out diffusion of the particles (e.g., gas) from the substrate. In particular, the temperature is maintained below the diffusion temperature, which causes gas produced by the particles to escape from the substrate. So, the substrate temperature is controlled throughout the PIII operation and is maintained below the critical temperature where gas produced in the substrate by the PIII process diffuses rapidly and escapes from the substrate. Hydrogen implantation of silicon, for example, has a critical temperature of about 500° C. Accordingly, the PIII process becomes substantially ineffective due to the absence of bubble formation at temperatures above 500° C. in some embodiments. In silicon, for example, PIII is maintained between 20° and 450° C. for PIII of hydrogen to maintain bubbles at the selected depth.

Figure 3:
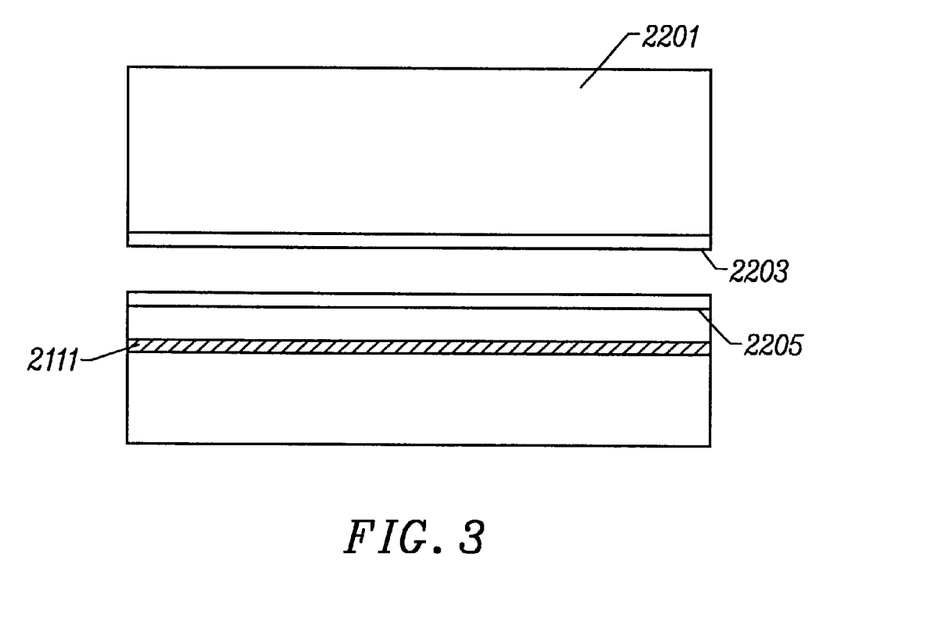

The process uses a step of joining the implanted silicon wafer to a workpiece or receptor wafer, as illustrated in FIG. 3. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to selfbond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the receptor wafer. For instance, an electrostatic bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 4:
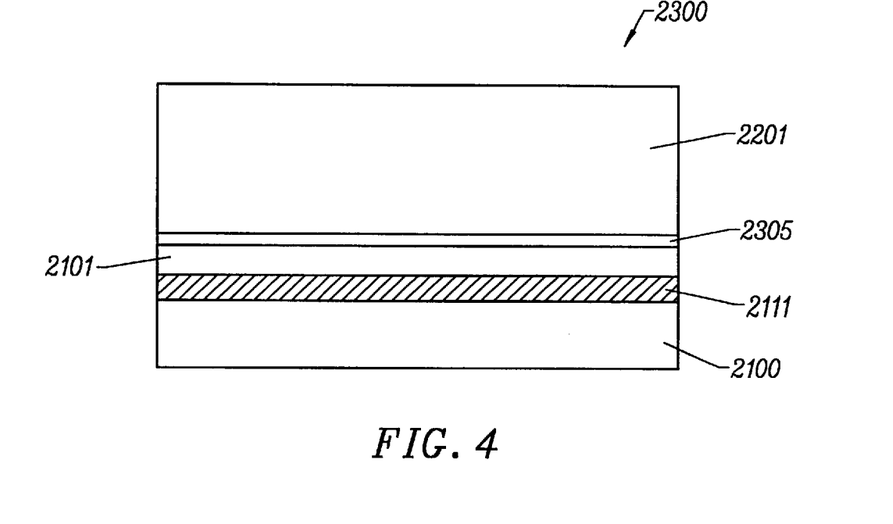

After bonding the wafers into a sandwiched structure 2300, as shown in FIG. 4, the method includes a film separation process or cut process to remove the substrate material to provide a thin film of substrate material 2101 overlying an insulator 2305 wafer 2201. To separate the film of material from the substrate, an energy or stress of the substrate material is increased toward an energy level necessary to initiate the cleaving action to free the film of material. In particular, a global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global energy source increases a level of energy or stress in the material region to free the film of material from the substrate.

As merely an example, separation occurs by global heat treatment of the bonded structure. In particular, the bonded structure is placed in a thermal treatment furnace or the like. The furnace applies heat to the structure to a temperature above the temperature that PIII takes place and adequate enough to create a crystalline rearrangement effect in the wafer. Additionally, the thermal treatment creates a pressure effect in microbubbles, which creates separation between the thin film of material from the bonded substrate. A process of removing the thin film of material from the bonded substrate is often termed conventional Smart Cut™, which blisters off a film of material from the substrate. This process is commonly time consuming and expensive by way of conventional beam line implantation techniques, but becomes highly cost effective by way of the novel PIII techniques.

Figure 5:
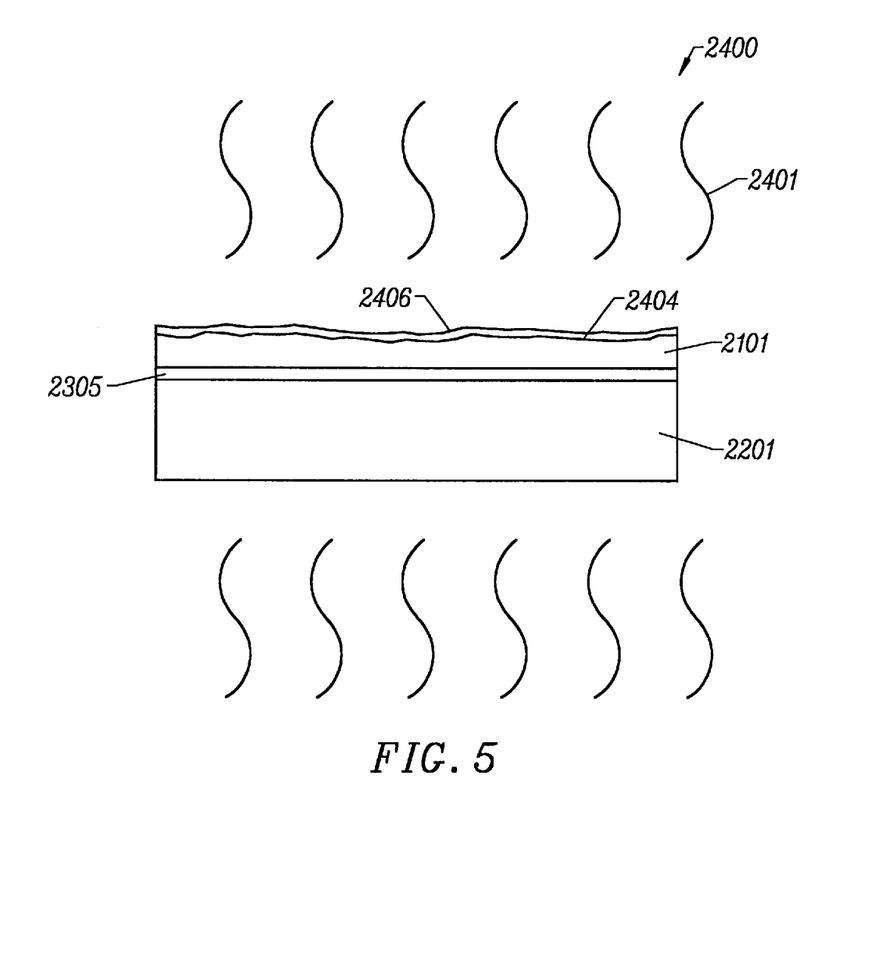

After removing the film of material, a final bonding step occurs between the target wafer and thin film of material region according to some embodiments, as illustrated by FIG. 5. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the receptor wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700° C).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 5. The detached surface of the film of silicon material is often rough 2404 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 6:
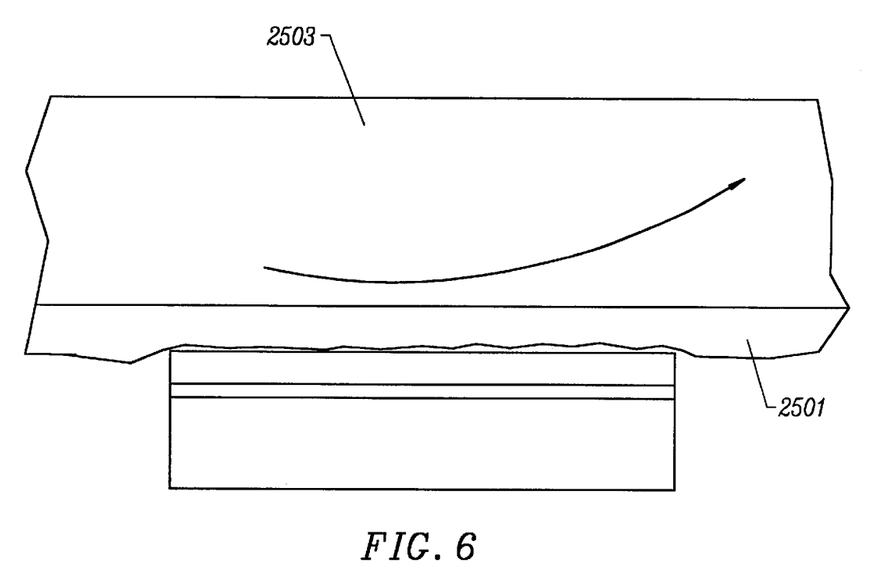

Alternatively, chemical mechanical polishing or planarization ("CMP") techniques finish the detached surface of the film, as illustrated by FIG. 6. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 7:
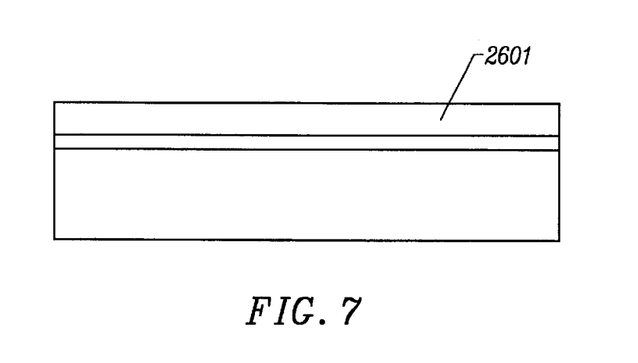

This acid solution generally interacts with the silicon material from the wafer during the polishing process. The polishing process preferably uses a poly-urethane polishing pad. An example of this polishing pad is one made by Rodel and sold under the tradename of IC-1000. The polishing pad is rotated at a selected speed. A carrier head which picks up the target wafer having the film applies a selected amount of pressure on the backside of the target wafer such that a selected force is applied to the film. The polishing process removes a selected amount of film material, which provides a relatively smooth film surface 2601 for subsequent processing, as illustrated by FIG. 7.

In certain embodiments, a thin film of oxide overlies the film of material overlying the receptor wafer. The oxide layer forms during the thermal annealing step, which is described above for permanently bonding the film of material to the receptor wafer. In these embodiments, the finishing process is selectively adjusted to first remove oxide and the film is subsequently polished to complete the process. Of course, the sequence of steps depends upon the particular application.

Figure 8:
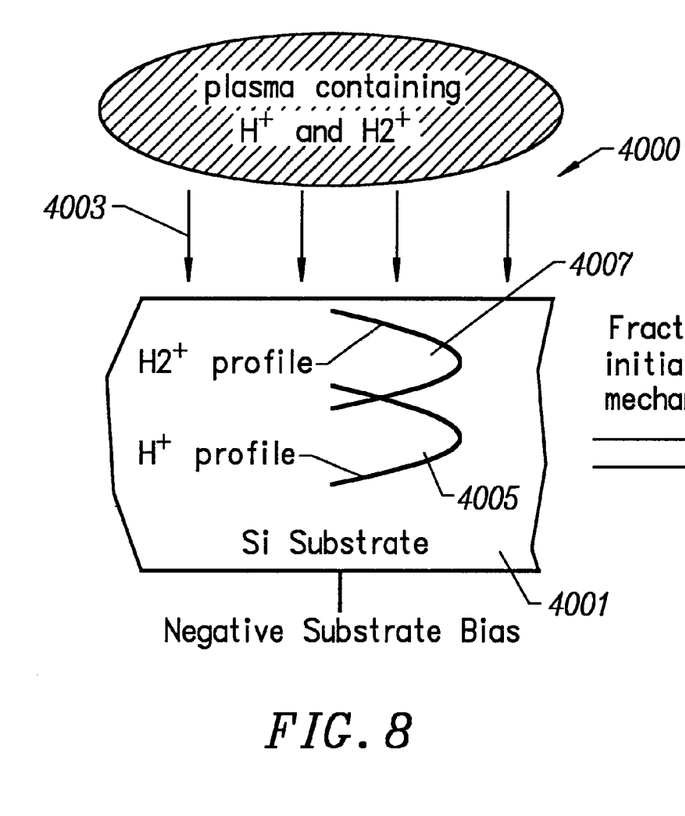
FIGS. 8–9 are simplified cross-sectional view diagrams of a process for fabricating a silicon-on-insulator wafer according to the present invention.
Figure 9:
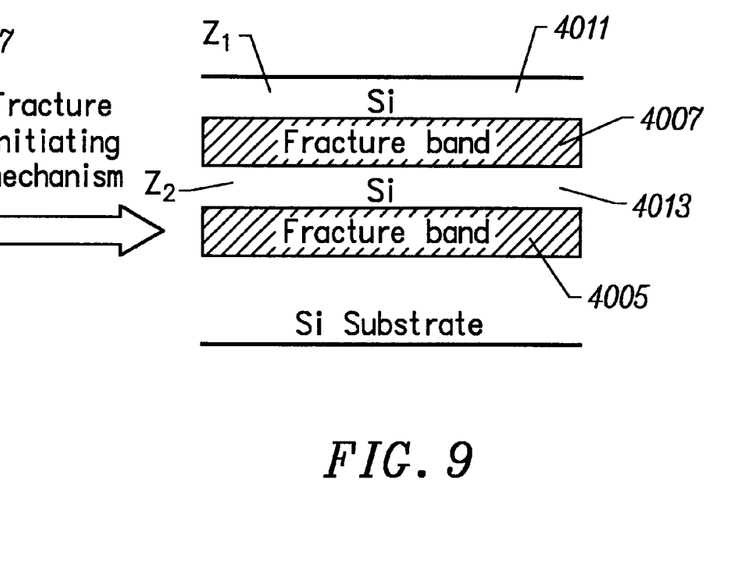

FIGS. 8–9 are simplified cross-sectional view diagrams of an alternative process for fabricating a silicon-on-insulator wafer according to the present invention. These diagrams are merely illustrations and should not limit the scope of the claims herein. One of ordinary skill in the art would recognize other variations, alternatives, and modifications. As shown, these diagrams illustrate a double cleaving process according to the present invention.

The process 4000 begins by providing a semiconductor substrate similar to the substrate 4001, as shown by FIG. 8. Substrate 4001 can be a multilayered wafer as well as a bulk wafer, e.g., silicon. Substrate 4001 is implanted 4003 using a selected mixture of particles to create two fracture zones 4003 and 4005. The two fracture zones can be made by way of two implanting steps or a single PIII step, which is properly tuned. For example, a hydrogen plasma can be tuned by achieving approximately a 1:2 ratio of $H_2^+:H^+$ ion concentrations for implanting into silicon. Implantation dose can range from about $10^{15}$ ions/cm$^2$ to about $10^{18}$ ions/cm$^2$, and others. Temperature can range from about −200° C. to about 500° C., and others.

After implantation, substrate or donor includes a first material region 4011 to be removed, and a second material region 4013 to be removed, which are each a thin relatively uniform film derived from the substrate material, as shown in FIG. 9. The first material region also includes a thickness ($z_1$) and the second material region includes a thickness ($z_2$), within the thickness of the silicon wafer. Optionally, a dielectric layer (e.g., silicon nitride, silicon oxide, silicon oxynitride) overlies the top surface of the substrate. The present process provides a novel technique for removing the two material regions.

The implanted substrate is then subjected to energy to detach the material regions from the bulk substrate. A variety of techniques can be used to detach the material regions from the bulk substrate. In particular, a global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region to free the films of material from the substrate.

As merely an example, separation occurs by global heat treatment of the bonded structure. In particular, the bonded structure is placed in a thermal treatment furnace or the like. The furnace applies heat to the wafer to a temperature above the temperature that PIII takes place and adequate enough to create a crystalline rearrangement effect in the wafer. Additionally, the thermal treatment creates a pressure effect in the microbubbles, which creates separation between the thin film of material from the bonded substrate. A process of removing the films of material from the bonded substrate is often termed conventional Smart Cut™, which blisters off a film of material from a substrate. This process is commonly time consuming and expensive by way of conventional beam line implantation techniques, but becomes highly cost effective by way of the novel PIII techniques.

Although the above technique is described generally in terms of a PIII process, the process can be altered or modified. For example, the PIII process can be patterned by way of a "shadow" mask. Additionally, the PIII process can be performed on more than one wafer, or a plurality of wafers for throughput purposes. One of ordinary skill in the art would recognize other variations, modifications, and alternatives.

Figure 10:
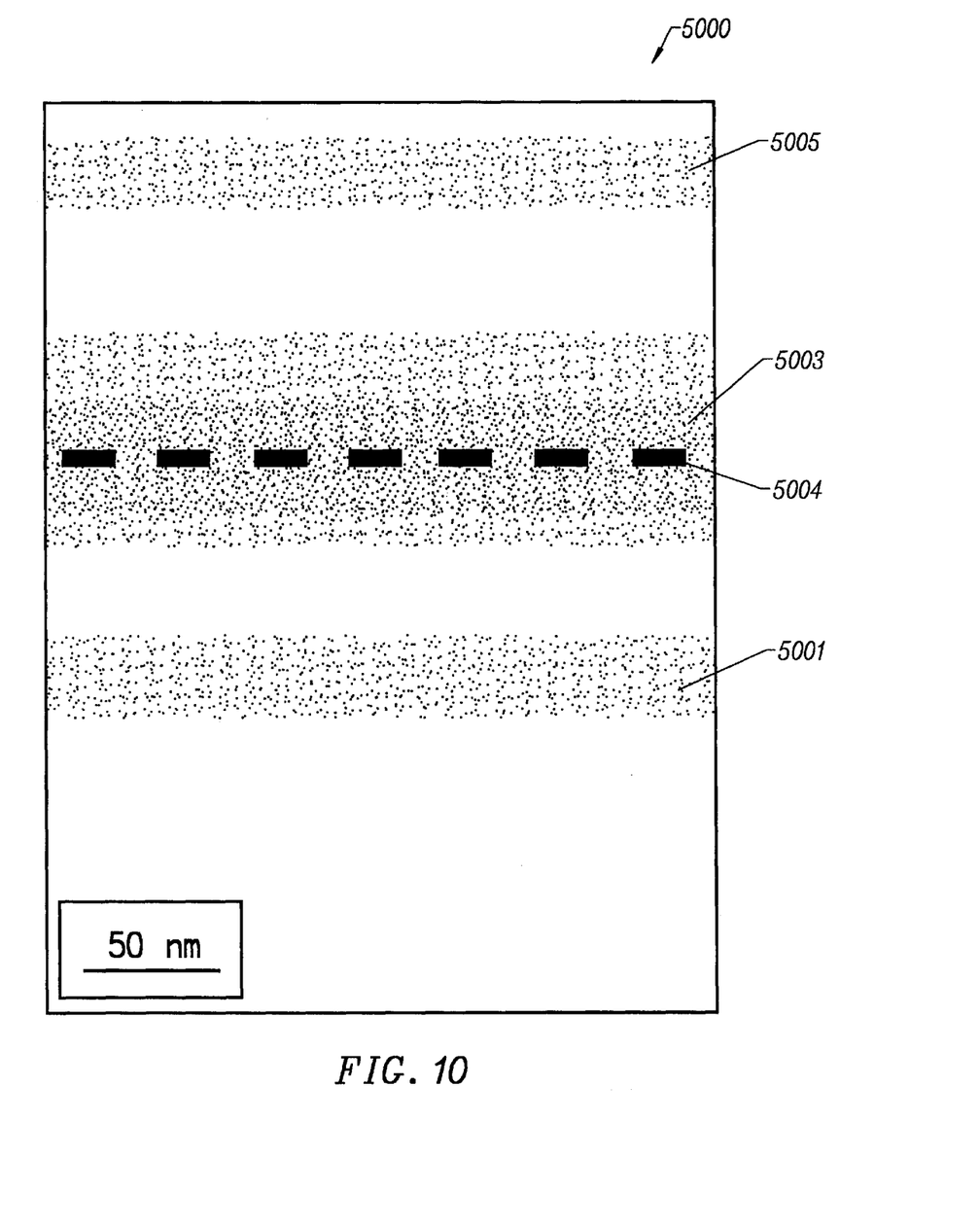
FIG. 10 is a photograph of a silicon-on-insulator wafer made according to the present invention.

Experiments:

To prove the principle and operation of the present invention, an experiment has been performed. In this experiment, a sample silicon wafer was used to show the use of PIII in separating a film of material from the wafer. The experiment used a bulk silicon wafer such as a product made by Wacker, but can be others. The bulk silicon wafer was oxidized to form an oxide layer overlying a surface of the silicon wafer. The oxide layer was 100 nm in thickness. The wafer was then placed in a PIII apparatus such as the product made by the University of California, Berkeley, but can be others. Hydrogen plasma was used as the PIII plasma source. The plasma excitation was chosen such as $H_2^+$ was the dominant specie with more than 90% ion content. A bias of $-35$ kV was used with a nominal H dose of $1 \times 10^{17}$ atoms/cm$^2$. After the PIII process, the implanted silicon wafer was bonded. Thermal treatment (i.e., annealing) was used to free the film of material from the bulk substrate. Thermal treatment occurred in a furnace at a temperature of about 500° C. A XTEM micrograph of FIG. 10 shows the bonded silicon wafer 5000, which forms a silicon on insulator substrate. The micrograph shows a bulk silicon structure 5001, an oxide interface layer 5003, an interface 5004, and a silicon film 5005, which included a detached portion. This experiment proves the effectiveness of the PIII process for separating films from bulk substrates. Additionally, in most cases, PIII can be performed at about one-tenth the time of conventional implanting, which is desirable in the manufacture of silicon-on-insulator substrates.

Although the above has been generally described in terms of a PIII system, the invention can also be applied to any high capacity ion implantation system. For example, the present invention can be applied to an ion shower, other non-mass separated systems, and other high capacity systems, such as a Nissin Machine. See, for example, Matsuda et, al., "Large Diameter Ion Beam Implantation System," Nuclear Instruments and Methods, Vol. B21, pp. 314–316, 1987, which is hereby incorporated by reference for all purposes. Additionally, the invention above is generally described in terms of the manufacture of silicon on insulator substrates. The invention, however, can be applied to almost any type of substrate including multi-layered or bulk.

While the above is a full description of the specific embodiments, various modifications, alternative constructions and equivalents may be used. For example, while the description above is in terms of a silicon wafer, it would be possible to implement the present invention with almost any type of substrate such as gallium nitride, silicon carbide, diamond, germanium, and the like. Additionally, the invention can be applied to devices such as three dimensional integrated circuits, monolithic integration of active circuit elements, photonic devices, sensors and actuators, and others. Therefore, the above description and illustrations should not be taken as limiting the scope of the present invention which is defined by the appended claims.

What is claimed is:

1. A method for fabricating substrates, said method comprising:

providing a substrate;

placing the substrate in a plasma atmosphere and implanting ions into a surface of said substrate to a first desired depth to provide a first distribution of said ions using plasma immersion ion implantation, said implanted ions defining a first thickness of material above said implant; and increasing global energy of said substrate to initiate a cleaving action, said cleaving action being sufficient to completely free said thickness of material from a remaining portion of said substrate.

2. The method of claim 1 wherein said energy is selected from chemical, mechanical, or thermal.

3. The method of claim 2 wherein said thermal energy is provided by a furnace.

4. The method of claim 3 wherein said increased global energy causes microcavities and/or microbubbles to form at said first desired depth in said substrate.

5. The method of claim 1 wherein said implanting step is a patterned.

6. The method of claim 1 wherein said implanting step provides a second distribution of said ions at a second desired depth, said second distribution of ions defining a second thickness of material from said second desired depth to said first desired depth.

7. The method of claim 6 wherein said second desired depth is different than said first desired depth.

8. The method of claim 6 wherein said ions at said first desired depth have a different mass and/or charge state than said ions at said second desired depth.

9. The method of claim 6 wherein said step of increasing global energy also initiating a cleaving action sufficient to completely free said second thickness of material from a remaining portion of said substrate.

10. The method of claim 1 wherein said ions are derived from helium gas or its isotopes.

11. The method of claim 1 wherein said ions are derived from hydrogen gas or its isotopes.

12. A method for fabricating substrates, said method comprising:

providing a substrate:
placing the substrate in an ion atmosphere and implanting ions into a surface of said substrate to a first desired depth to provide a first distribution of said ions using a process selected from plasma immersion ion implantation or ion shower, said implanted ions defining a first thickness of material above said implant; and
removing said first thickness of said material by increasing global energy of said substrate to initiate a cleaving action, said cleaving action being sufficient to free said thickness of said material from said substrate.

13. The method of claim 12 wherein said increased global energy being selected from chemical, mechanical, or thermal.

14. The method of claim 13 wherein said thermal energy is provided by a furnace.

15. The method of claim 13 wherein said increased global energy causes microcavities to form at said first desired depth in said substrate.

16. The method of claim 12 wherein said implanting step is a patterned.

17. The method of claim 12 wherein said implanting step provides a second distribution of said ions at a second desired depth, said second distribution of ions defining a second thickness of material from said second desired depth to said first desired depth.

18. The method of claim 17 wherein said second desired depth is different than said first desired depth.

19. The method of claim 17 wherein said ions at said first desired depth have a different mass and/or charge state than said ions at said second desired depth.

20. The method of claim 17 wherein said step of removing also removing said second thickness of material from said substrate.

21. The method of claim 12 wherein said ions are derived from helium gas or its isotopes.

22. The method of claim 12 wherein said ions are derived from hydrogen gas or its isotopes.

23. The method of claim 12 wherein said step of implanting ions is a multiple implant step.

24. The method of claim 12 wherein said step of implanting ions is a multiple implant step using different ions.

25. The method of claim 12 wherein said step of implanting ions is a multiple implant step using different implant doses.

26. The method of claim 12 wherein said step of implanting ions is a multiple implant step using different energies.

27. The method of claim 12 wherein said step of implanting ions is a multiple implant step using different temperatures.

28. A method for fabricating substrates, said method comprising:
providing a substrate:
placing the substrate in an ion atmosphere and
implanting ions into a surface of said substrate to a first desired depth to provide a first distribution of said ions using a non-mass separated system, said implanted ions defining a first thickness of material above said implant; and
increasing global energy of said substrate to initiate a cleaving action, said cleaving action being sufficient to completely free said thickness of material from a remaining portion of said substrate.

29. The method of claim 28 wherein said energy is selected from chemical, mechanical, or thermal.

30. The method of claim 29 wherein said thermal energy is provided by a furnace.

31. The method of claim 30 wherein said increased global energy causes microcavities and/or microbubbles to form at said first desired depth in said substrate.

32. The method of claim 28 wherein said implanting step is patterned.

33. The method of claim 28 wherein said implanting step provides a second distribution of said ions at a second desired depth, said second distribution of ions defining a second thickness of material from said second desired depth to said first desired depth.

34. The method of claim 33 wherein said second desired depth is different than said first desired depth.

35. The method of claim 33 wherein said ions at said first desired depth have a different mass and/or charge state than said ions at said second desired depth.

36. The method of claim 33 wherein said step of increasing global energy also initiating a cleaving action sufficient to completely free said second thickness of material from a remaining portion of said substrate.

37. The method of claim 28 wherein said ions are derived from helium gas or its isotopes.

38. The method of claim 28 wherein said ions are derived from hydrogen gas or its isotopes.

39. A method for fabricating substrates, said method comprising:
providing a substrate;
implanting ions into a surface of said substrate to a first desired depth to provide a first distribution of said ions using a process selected from plasma immersion ion implantation or ion shower or another non-mass separated system, said implanted ions defining a first thickness of material above said implant; and
removing said first thickness of said material by increasing global energy of said substrate to initiate a cleaving action, said cleaving action being sufficient to free said thickness of said material from said substrate.

40. The method of claim 39 wherein said increased global energy being selected from chemical, mechanical, or thermal.

41. The method of claim 40 wherein said thermal energy is provided by a furnace.

42. The method of claim 40 wherein said increased global energy causes microcavities to form at said first desired depth in said substrate.

43. The method of clam 39 wherein said implanting step is patterned.

44. The method of claim 39 wherein said implanting step provides a second distribution of said ions at a second desired depth, said second distribution of ions defining a second thickness of material from said second desired depth to said first desired depth.

45. The method of claim 44 wherein said second desired depth is different than said first desired depth.

46. The method of claim 44 wherein said ions at said first desired depth have a different mass and/or charge state than said ions at said second desired depth.

47. The method of claim 44 wherein said step of removing also removing said second thickness of material from said substrate.

48. The method of claim 39 wherein said ions are derived from helium gas or its isotopes.

49. The method of claim 39 wherein siad ions are derived from hydrogen gas or its isotopes.

50. The method of claim 39 wherein said step of implanting ions is a multiple implant step.

51. The method of claim 39 wherein said step of implanting ions is a multiple implant step using different ions.

52. The method of claim 39 wherein said step of implanting ions is a multiple implant step using different implant doses.

53. The method of claim 39 wherein said step of implanting ions is a multiple implant step using different energies.

54. The method of claim 39 wherein said step of implanting ions is a multiple implant step using different temperatures.

55. The method of claim 39 wherein a selected mixture of particles is used to create two fracture zones.

56. The method of claim 1 wherein the substrate comprises silicon.

57. The method of claim 12 wherein the substrate comprises silicon.

58. The method of claim 28 wherein the substrate comprises silicon.

59. The method of claim 39 wherein the substrate comprises silicon.

* * * * *